(12) United States Patent
Lee

(10) Patent No.: US 6,380,081 B1
(45) Date of Patent: Apr. 30, 2002

(54) METHOD OF VAPORIZING LIQUID SOURCES AND APPARATUS THEREFOR

(75) Inventor: Kyu Hong Lee, Faejon (KR)

(73) Assignee: Genitech, Inc. (KR)

( * ) Notice: Subject to any disclaimer, the term of this patent is extended or adjusted under 35 U.S.C. 154(b) by 0 days.

(21) Appl. No.: 09/718,837

(22) Filed: Nov. 20, 2000

(30) Foreign Application Priority Data

Nov. 18, 1999 (KR) .............................. 99 51206

(51) Int. Cl.[7] .................. H01L 21/44; H01L 21/31; H01L 21/469

(52) U.S. Cl. .................. 438/681; 118/715; 118/726; 438/680; 438/685; 438/785

(58) Field of Search ................. 438/681, 680, 438/685, 758, 785; 118/715, 726

(56) References Cited

U.S. PATENT DOCUMENTS

| | | | | |
|---|---|---|---|---|
| 5,090,985 A | | 2/1992 | Soubeyrand et al. ....... 65/60.52 |
| 5,553,188 A | * | 9/1996 | Ewing ......................... 392/394 |
| 5,835,677 A | * | 11/1998 | Li et al. ...................... 118/726 |
| 5,836,289 A | * | 11/1998 | Thring et al. ............... 123/549 |
| 6,136,725 A | * | 10/2000 | Loan et al. .................. 438/758 |
| 6,143,077 A | * | 11/2000 | Ikeda et al. ................. 118/726 |

OTHER PUBLICATIONS

Gerthsen, Kneser, Vogel. Physik. Springer–Verlag Heidelberg Berling, New York, 1977; pp. 187–191.

The Clausian–Clapeyron equation. [online] http://chem.132.stanford.edu/fall 99/chem 171/handouts/node 75.html. [retrieved on Feb. 13, 2001] Retrieved from Internet database.

* cited by examiner

Primary Examiner—John F. Niebling
Assistant Examiner—Alexander G. Guyka
(74) Attorney, Agent, or Firm—Marger, Johnson & McCollom, P.C.

(57) ABSTRACT

A method and apparatus for vaporizing liquid source materials, where such vaporized source materials are supplied to a deposition tool such as Chemical Vapor Deposition (CVD) apparatus, and more particularly in such areas as Metalorganic Chemical Vapor Deposition (MOCVD) and Atomic Layer Deposition (ALD) applications, is disclosed. The method disclosed herein involves with increasing the temperature and the pressure of given liquid source materials to a high level of temperature and pressure states while maintaining the source materials in a liquid state, and then exposing the liquid source material instantaneously to a low pressure while maintaining the temperature of the liquid source material at the high temperature. Such sudden exposure to a low pressure makes the liquid source material vaporized, so that such vaporized source material can be supplied to such deposition tools as Metalorganic Chemical Vapor Deposition (MOCVD) and Atomic Layer Deposition (ALD) apparatus. The structure and the operation of the apparatus that vaporizes liquid source materials in accordance with the present invention are also disclosed.

16 Claims, 10 Drawing Sheets

METHOD OF VAPORIZING LIQUID SOURCES AND APPARATUS THEREFOR

BACKGROUND OF THE INVENTION

1. Field of the Invention

The present invention relates to a method of vaporizing liquid source materials for supplying such vaporized source materials to Chemical Vapor Deposition(CVD) apparatus, and more particularly in such areas as Metalorganic Chemical Vapor Deposition (MOCVD) and Atomic Layer Deposition (ALD) applications.

2. Description of the Related Art

As a part of semiconductor device manufacturing processes, it has been active in developing methods of Chemical Vapor Deposition (CVD) processes, more particularly, in such areas of Metalorganic Chemical Vapor Deposition (MOCVD) and Atomic Layer Deposition (ALD) applications, in order to form high quality films by using metalorganic source materials. However, since most of the metalorganic source materials are in either liquid state or solid state at room temperature, it is necessary to vaporize such source materials before they are supplied to the reaction chamber of the Chemical Vapor Deposition (CVD) apparatus.

As a result, several different methods of vaporizing liquid or solid source materials have been proposed, among which the simple one is to heat the source material to certain temperature until the source material evaporates.

However, this method is neither suitable for the materials which are thermally unstable at the vapor temperature nor suitable for the materials of which the vapor pressure is very low. Furthermore, in case of the liquid source material made of a solid source material by dissolving it with a solvent, the solvent vaporizes before the solute does. This means that the liquid becomes viscous easily or generate solute particles as it gets exposed in the atmosphere for a period of time. Therefore, it is difficult to maintain a steady flow of the source materials since the vapor pressure of the source material changes in time due to, for example, either high viscosity compared to the fresh liquid source material or the change of the surface area of solute particles. As a result, steady supply of vaporized source material at a constant rate becomes difficult.

Other methods of vaporizing the source materials either in liquid state or solid state have been suggested by R. H. Thring [U.S. Pat. No. 5,836,289 (1998)]. In order to increase the speed of evaporation, Thring (Porous Element Fuel Vaporizer) proposed to use a heated porous element to push liquid source material through it, and at the same time, carrier gas is also pushed through the porous element so that the mixture of the vaporized source material and the carrier gas is supplied to the desired reactor.

Li, et al [U.S. Pat. No. 5,835,677 (1998)] suggested to use an ultrasonic injection nozzle in conjunction with the method suggested by Thring aforementioned in order to improve the efficiency of the vaporization before the vaporized source material is forced into a CVD reaction chamber.

Another improved invention is suggested by J. H. Ewing [U.S. Pat. No. 5,553,188 (1996)] by using a stack of coaxially aligned, thermally conductive, thin, flat disks having different diameters, thereby allowing to form liquid films over a large surface area of the disks so that when carrier gas is forced into this large area coated with film formed by the liquid source material, the carrier gas pick up the vaporized source material more efficiently from the large surface area on the disks.

However, all the previous methods described above using either porous elements or a stack of coaxially aligned, thin, flat disks have a common problem of getting clogged with the source material deteriorated in time due to easy condensation or solidification of the liquid source material in the small and narrow areas, thereby a smooth flow of the source material into the CVD reaction chamber is disturbed by such clogging.

SUMMARY OF THE INVENTION

The object of the present invention is to resolve the problems with the prior arts described above, that is, to steadily and in desired quantities supply the necessary source materials to a CVD reaction chamber by vaporizing liquid source materials whether they are in liquid form originally or, in case of a solid source material, dissolved one by using appropriate solvent in order to make it in liquid form.

Another object of the present invention is to supply the necessary source materials in a fashion of pulsation to the CVD reaction chamber.

Another object of the present invention is to disclose an apparatus for vaporizing liquid source materials at a steady rate, whereby the flow of the vaporized liquid source material can be easily controlled, and also the clogging in the vaporizer can be eliminated.

Another object of the present invention is to disclose an apparatus for vaporizing liquid source materials in a fashion of pulsation. But, when the operation of the vaporization apparatus is ceased, it stops almost immediately so that the residual liquid source material would not flow into the CVD reaction chamber.

Yet another object of the present invention is to disclose an apparatus for vaporizing liquid source materials where the deteriorated source material in the reservoir can be easily removed in order to clear the reservoir without dumping the deteriorated source material into the reaction chamber of a CVD apparatus.

For CVD process applications aforementioned, it is desirable to supply vaporized liquid source materials to the reaction chamber of a CVD apparatus. This invention discloses a method and apparatus for vaporizing liquid source materials for CVD applications, more particularly, in such areas as, but not limited to, Metalorganic Chemical Vapor Deposition (MOCVD) and Atomic Layer Deposition (ALD) applications.

According to the present invention, a liquid source material at an equilibrium state at temperature T1 and pressure P1 is heated and pressurized to another equilibrium state at higher temperature T2 and higher pressure level P2 in such a way that the liquid source material is not vaporized during this process. In accordance with the present invention, the liquid source material is pushed through a small opening instantaneously to a lower pressure, such as P3 where P3 is lower than P2, while the temperature T2 is maintained at a similar level, in order to vaporize the liquid source material, during which period the liquid source material becomes vaporized due to sudden drop in pressure as well as due to sudden exposure to a low pressure.

This invention also discloses an apparatus and its variations for vaporizing liquid source materials using the method described above. The apparatus comprises a relatively small vent tube capped with a disk-like flat surface, called "stopper," a reservoir for the liquid source material, a gas discharge tube for the vaporized source material, a heating element that heats the liquid source material to keep the temperature of the liquid source material at an appropriate temperature so the liquid material can be easily vaporized when there is a sudden pressure change, and finally a metering pump that supplies the desired liquid source material at a pressure level in the neighborhood of P2.

The present invention has an advantage of requiring only a small exposed area or the area around said vent tube with a flat cap, called "stopper," for vaporizing the liquid source material, thereby reducing the possibility of being clogged up compared to the prior art where the vaporizing element becomes clogged easily due to the fact that the excessive liquid source material is turning into a viscous state around the vaporizing element whether it is a porous element or set of thin flat disks.

Several variations of vaporization apparatus are also disclosed.

All objects, features, and advantages of the present invention will become apparent in the following detailed written description after a brief description of the drawings.

BRIEF DESCRIPTIONS OF THE DRAWINGS

The present invention itself, as well as preferred modes and advantages thereof, will best be understood by reference to the following detailed description of illustrative embodiments when read in conjunction with the accompanying drawings, wherein.

DETAILED DESCRIPTION OF THE PRESENT INVENTION

Figure 1:
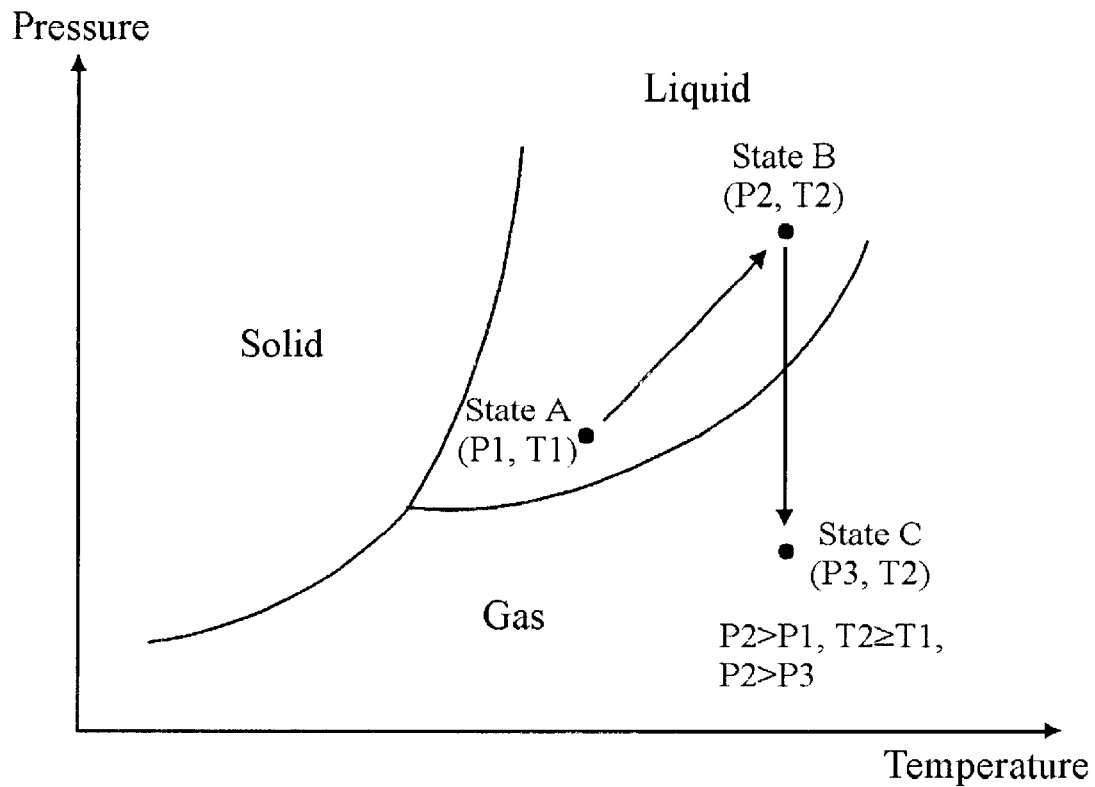
FIG. 1 is a state diagram for a given source material showing the boundaries of the gas, liquid and solid states as a function of temperature and pressure.

In accordance with the present invention, referring to FIG. 1, given a liquid source material initially in a first equilibrium state (state A) at a temperature T1 and a pressure P1, the source material is heated and pressurized until it reaches a second equilibrium state (state B) at a higher temperature T2 and a pressure P2 in a way that the liquid source does not vaporize during the transition. In FIG. 1, this process is illustrated by an arrow from the state A to the state B.

In order to vaporize the liquid source material, it is exposed instantaneously to a lower pressure P3 while the temperature of the liquid source material is maintained at the same level as T2 (state C). During this transition, the liquid source material is pushed into an open space in a collecting tube or a vent with the lower pressure P3 while keeping the temperature of the liquid source material at the same level as T2. In FIG. 1, this process is illustrated by an arrow from the state B to the state C.

During the transition from the high temperature-high pressure state B to the high temperature-low pressure state C in FIG. 1, the liquid source material is vaporized because the state of the source material is instantaneously changed from the liquid state B to the gas state C under the same temperature T2. The vaporized source material produced by this method is collected using an appropriate method and fed into the reaction chamber for chemical vapor deposition (CVD).

In accordance with another aspect of the present invention, an apparatus is provided to vaporize the liquid source material and to collect the resultant vapor source material as well as to supply the resultant vapor source material steadily into the CVD reaction chamber. To this end, the apparatus comprises a liquid source material supply line, a reservoir that contains the liquid source material fed through the supply line, a vent with a stopper that opens and closes by means of mechanical or fluidic pressure and also allows the pressurized liquid source material to pass through the stopper to be exposed instantaneously to a low pressure to vaporize the liquid source material during the sudden transition from a high pressure state to a low pressure state, and a gas transport tube that carries the vaporized source material to a desired destination such as the CVD reaction chamber.

According to the present invention, the apparatus also contains a metering pump that supplies the liquid source material to the reservoir under a certain desired pressure level such as P2, and a means of applying pressure to the stopper, by either mechanical or fluidic means, so that the vent is in a closed position when the pressure of the liquid source material is less than the stopper pressure applied by a pressurizer, and the vent opens when the pressure of the liquid source material is higher than the stopper pressure. Normally, the stopper pressure is kept at a fixed level, e.g., slightly higher than P2, when the apparatus is not in use.

Finally, the apparatus is also optionally equipped with a heater that heats the liquid source material to a temperature T2, if it needs to be, depending upon the types of the liquid source materials used. Certain source materials need to be heated, and others do not.

The present invention will best be understood by reference to the following detailed exemplary and preferred embodiments.

The present invention may be realized in a variety of ways in implementing the method of vaporizing the desired liquid source materials aforementioned.

Some of the sample source materials in liquid state at atmospheric condition are TEOS [tetraethoxyorthosilicate, $Si(OCH_2CH_3)_4$], Tantalum pentaethoxide [$Ta(OCH_2CH_3)_5$], Titanium isopropoxide [$Ti[OCH(CH_3)_2]_4$], Zirconium tert-butoxide [Zr[OC(CH$_3$)$_3$]$_4$], Hafnium tert-butoxide [Hf[OC(CH$_3$)$_3$]$_4$], TDMAT [tetrakisdimethylamidotitanium, Ti[N(CH$_3$)$_2$]$_4$], TDEAT [tetrakisdiethylamidotitanium, Ti[N(CH$_2$CH$_3$)$_2$]$_4$], (hfac)Cu(vtms), where hfac means hexafluoroacetylacetonate and vtms means vinyltrimethylsilane, and some of the typical source materials in solid state requiring solvents such as toluene, THF (tetrahydrofuran) and n-butyl acetate to change into liquid state include Ba(thd)$_2$, where thd means tetramethylheptanedionate, Sr(thd)$_2$, Bi(thd)$_3$, La(thd)$_3$, Pb(thd)$_2$, Sr(thd)$_2$, Sr[Ta(OCH$_2$CH$_3$)$_6$]$_2$, and Cu(hfac)$_2$.

Some of the exemplary designs, structures and configurations of the apparatus for vaporizing liquid source materials for supplying to the CVD reaction chamber in accordance with the present invention are disclosed and presented herein. Those of ordinary skill in the art should be able to easily perform other designs, structures and configurations as desired within the spirit of the present invention. Therefore, the scope of the designs, structures and configurations in accordance with the present invention is not limited to the preferred embodiments presented here.

Preferred Embodiment 1

FIG. 1 is a phase diagram showing the boundaries between solid, liquid and gas states for a given liquid source material as a function of temperature and pressure. A liquid copper source material in the equilibrium state of atmospheric pressure (1 atm) and room temperature is pressurized to or above approximately 9 atm, preferably to or above 12 atm, e.g., P2=approximately 12 atm, while the temperature can stay virtually approximately the same, e.g., T1≅T2≅room temperature. The stopper pressure is preferably set at approximately 12 atm. When the pressure of the liquid source material is increased to 12 atm and eventually exceeds the threshold pressure of approximately 12 atm for the stopper, and then the liquid source material pushed the stopper upward, and the vent opens, and as a result, a small gap between the bottom of the stopper and the top of the vent opens. Then, the liquid source material the liquid source material passes through the small opening of the vent, and becomes instantaneously exposed to a low pressure, e.g., preferably less than or equal to approximately 20 Torrs, more preferably, approximately 2 to approximately 5 Torrs, for the MOCVD processes or the ALD processes. As a result, the liquid source, at the pressure of approximately 12 atm, becomes vaporized due to a sudden pressure drop from approximately 12 atm to the low pressure described above and is discharged through the gas discharge tube.

Preferred Embodiment 2

Figure 2A:
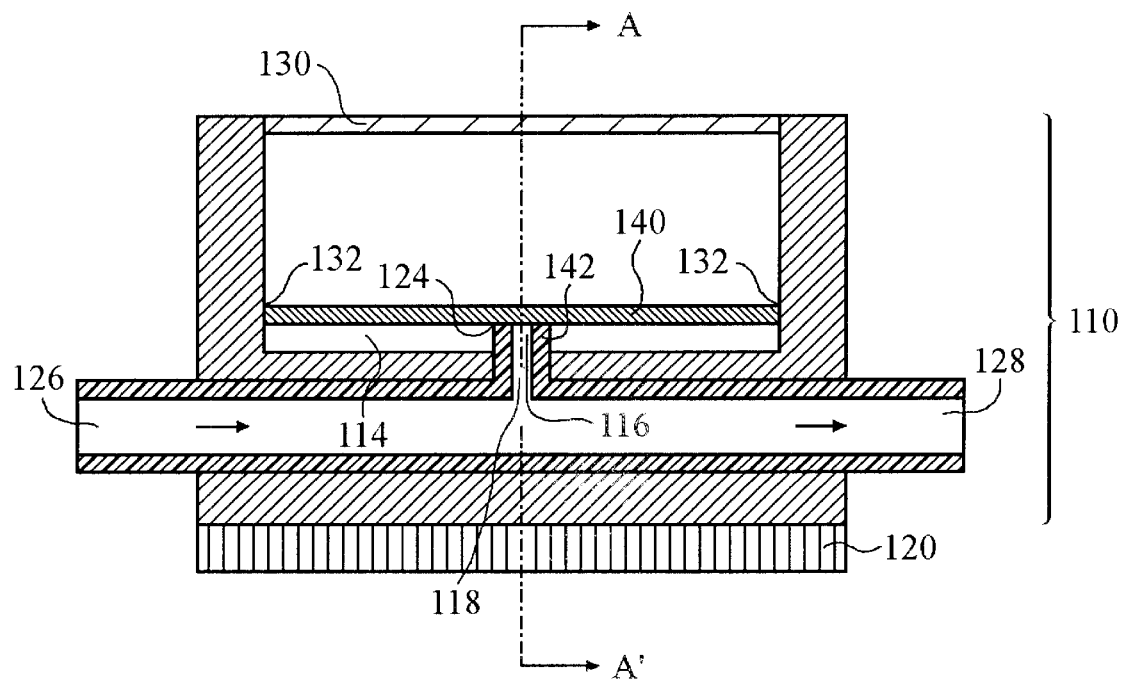
FIG. 2A is a cross-sectional view of an exemplary apparatus in accordance with the present invention.
Figure 2B:
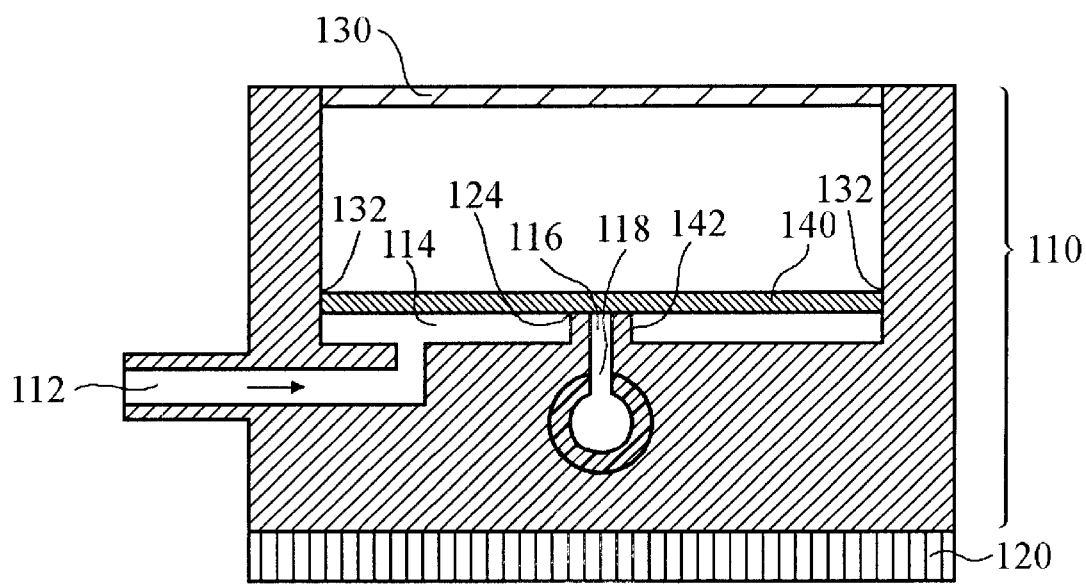
FIG. 2B is another cross-sectional view of FIG. 2A taken along the line A–A' in FIG. 2A.

Shown in FIG. 2A is a cross-sectional view of an exemplary apparatus in accordance with one embodiment of the present invention. FIG. 2B is another cross-sectional view of FIG. 2A taken along the line A—A' in FIG. 2A.

The exemplary vaporizing apparatus comprises a main body 110 and an optional heater 120. The main body 110 comprises a liquid source material supply line 112, a reservoir 114, a vent 116, a vent tube 142, a gas discharge tube 118, a stopper 140, a pressurized contact surface 124, an inlet carrier gas tube 126, an outlet carrier gas tube 128 which is connected to the inlet carrier gas tube 126, a pressurizer 130 and, a pressure tight contact 132 between the main body 110 and the stopper 140. The height of the vent tube 142 determines the desired space for the reservoir 114. A conventional metering pump 150 (not shown) is connected to the liquid source material supply line 112.

The optional heater 120 that heats the main body as well as the liquid source material in the reservoir 114 is shown in both the FIG. 2A and FIG. 2B.

Referring to FIG. 2A and FIG. 2B a liquid source material is supplied by the metering pump 150 (not shown) through the liquid source material supply line 112 until the reservoir 114 is filled with the liquid source material, which is under pressure P1. The liquid source material in the reservoir 114 remains therein because the pressurizer 130 pushes the stopper 140 downward so that the stopper 140 makes a tightly-pressurized contact surface 124 with the vent 116. The stopper 140 also fits tightly inside the main body 110. As a result, both the main body and the stopper make a pressure-tight peripheral contact 132. Therefore, as long as the pressurizer 130 pushes the stopper 140 downward against the vent 116 at a higher level than the pressure state of the liquid source material itself in the reservoir 114, the liquid source material remains inside the reservoir 114.

The pressure of the stopper 140 pressing down against the vent 116 is now set at the pressure level of P2, and the pressure inside the reservoir 114 is increased by using the metering pump 150 (not shown). At the same time, the temperature of the liquid source material in the reservoir 114 is increased to T2 by using the heater 120. When the temperature of the liquid source material is raised to T2 and the pressure inside the reservoir 114 is increased to exceed P2 by using the metering pump 150 (not shown), then, as soon as the pressure inside the reservoir 114 exceeds P2, the liquid source material pushes the stopper 140 upward and this action opens the vent 116. Because this occurs almost instantaneously, the liquid source material passes through the vent around the top surface of the annulus of the vent 116 and is exposed instantaneously to a low pressure inside of the vent 116. Consequently, the liquid source material is vaporized and is discharged through the vent tube 142. Eventually it is pushed through the gas discharge tube 118, where carrier gas flows, and picks up the vaporized source material. The mixture of the vaporized source material and the carrier gas travels through the outlet carrier gas tube 128 and then to the CVD reaction chamber.

There are several modes of operation in terms of the vent opening. The first mode is to maintain the pressure of the liquid source material high enough so that the stopper 140 is kept in an elevated, non-vent-sealing position. As a result, the vent 116 is in the open position. Thus, the liquid source material flows through the vent 116 steadily and continuously. Therefore, the vaporized source material is steadily and continuously supplied through the outlet carrier gas tube 128. The second mode is to maintain the pressure difference between the stopper 140 and the reservoir 114 at an appropriate level so that the vent 116 repeats the open-and-close actions, thereby supplying the vaporized source material in a fashion of pulsation.

In either mode of operations described above, the amount of the flow of the vaporized source material can be controlled by a metering pump 150 of which the output pressure of the metering pump 150 can exceed the pressure of the stopper 140. Those two modes aforementioned can be controlled by adjusting the output pressure of the metering pump 150.

The third mode is to sharply terminate the supply of the vaporized source material in order to prevent the undesirable residual liquid source material from passing through the vent 116 and then flowing into the CVD reaction chamber. This can be achieved by using an active-type metering pump that is capable of actively-as opposed to passively- and rapidly lowering its output pressure below the pressure of the stopper 140.

Preferred Embodiment 3

An exemplary apparatus for vaporizing liquid source material with a mechanical pressurizer is disclosed and presented here. Similar features among FIGS. 2A, 2B and 3 are designated similarly but with differentiated hundreds, e.g. 114 and 214 correspond.

Figure 3:
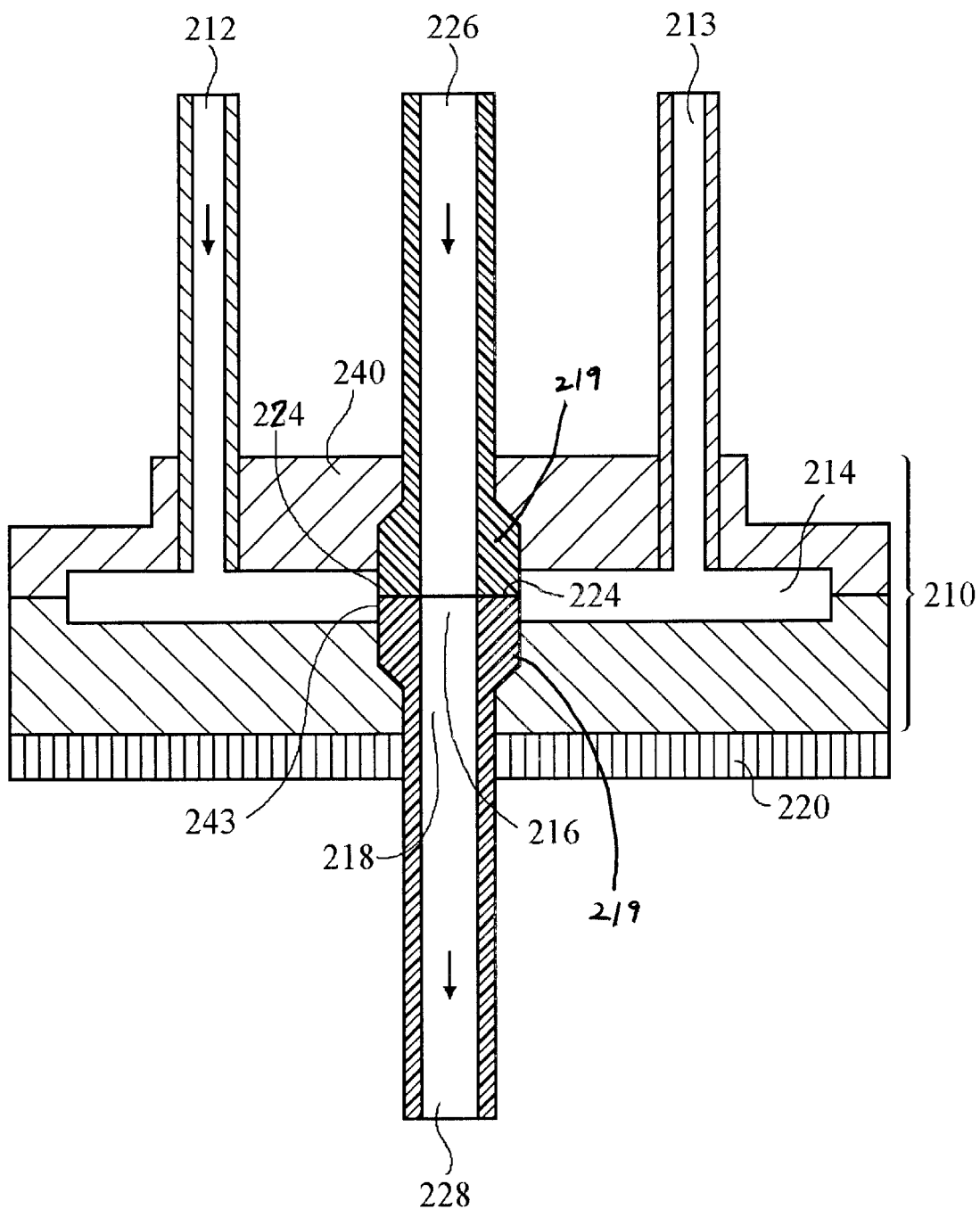
FIG. 3 is a cross-sectional view of another exemplary apparatus with a vertical carrier gas tube as well as a mechanically pressurized stopper in accordance with the present invention.

Referring to FIG. 3, the proposed apparatus is another aspect of the apparatus disclosed and presented in the Preferred Embodiment 2 above with the exception of vertically connected inlet and outlet carrier gas tubes 226 and 228, where the inlet carrier gas tube 226 and the outlet carrier gas tube 228 are connected with a vent 116 in the middle, where the combination of the inlet carrier gas tube 226 and the outlet carrier gas tube 228 is called the gas transport tube 219. vertically connected liquid source material supply line 212, more significantly, a mechanical stopper 240 and a clean-out tube 213, which is closed during a normal operation.

As the pressure in the reservoir 214 is increased until it exceeds the threshold pressure of the stopper 240, which have a spring effect downward, the liquid source material in the reservoir 214 pushes the stopper 240 and the pressurized contact surface 224 at the top surface of the vent 216 opens, and the liquid source material in the reservoir 214 passes through the vent opening, which is the top part of the vent 216. In other words, the pressurized contact surface 224 opens. Then, due to a sudden exposure to a low pressure in the vent 216 as well as the gas discharge tube 218 area, the liquid source material that passes through the vent opening vaporizes. Subsequently, the carrier gas in the gas discharge tube 218 picks up the vaporized source material and travels through the outlet carrier gas tube 228, and then, eventually to the CVD reaction chamber.

Other operational functions and workings not described here are the same as the Preferred Embodiment 2. For example, the flow of the vaporized source material can be controlled by adjusting the pressure in the metering pump. The use of the heater 220 is optional depending upon the nature of the liquid source material used. The clean-out hole 213 is for cleaning the reservoir after an extended use of the apparatus.

This is one example of many possible designs with mechanically pressurized stopper, where a separate pressurizer may potentially be eliminated. However, a pressurizer, either mechanical or fluidic may be added when one is needed.

Preferred Embodiments 4

Figure 4:
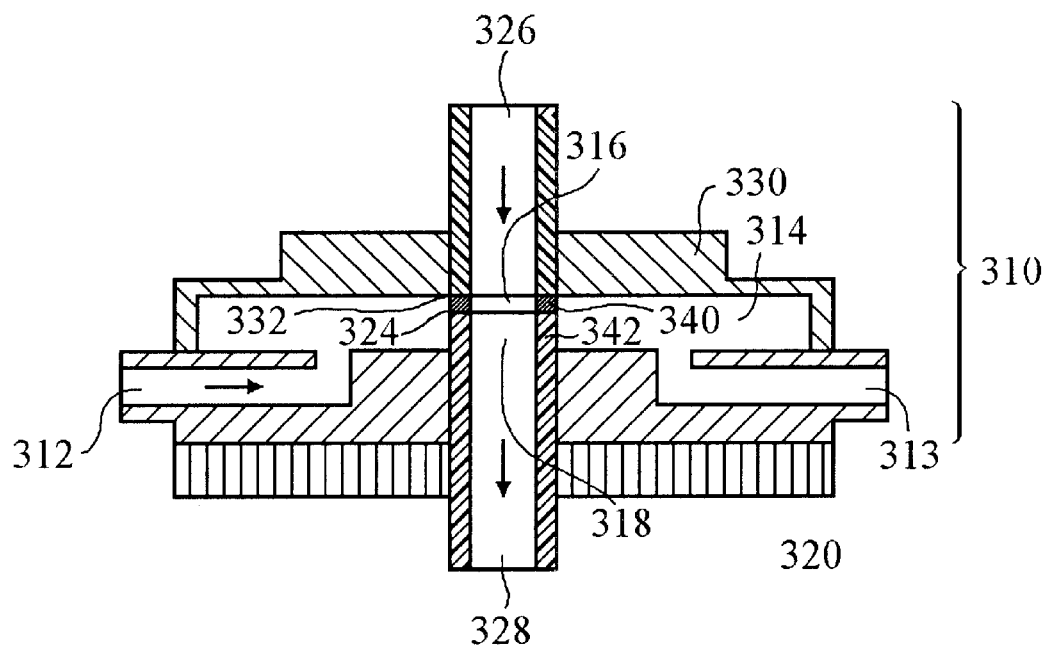
FIG. 4 is a cross-sectional view of another exemplary apparatus with a vertical carrier gas tube and a clean-out hole for the reservoir in accordance with the present invention.

Shown in FIG. 4 is another aspect of an apparatus that vaporizes a liquid source material in accordance with the present invention.

The subject apparatus shown in FIG. 4 has a ring-like stopper 340 with a vertically mounted inlet carrier gas tube 326 and the outlet carrier gas tube 328. The subject apparatus has a mechanical pressurizer 330. The main body 310 has a clean-out hole 313 for cleaning the reservoir 314.

The functions and workings of the apparatus disclosed and presented here, are similar to the apparatus disclosed and presented in the preferred embodiment 2, with like reference designators as explained above.

Figure 5:
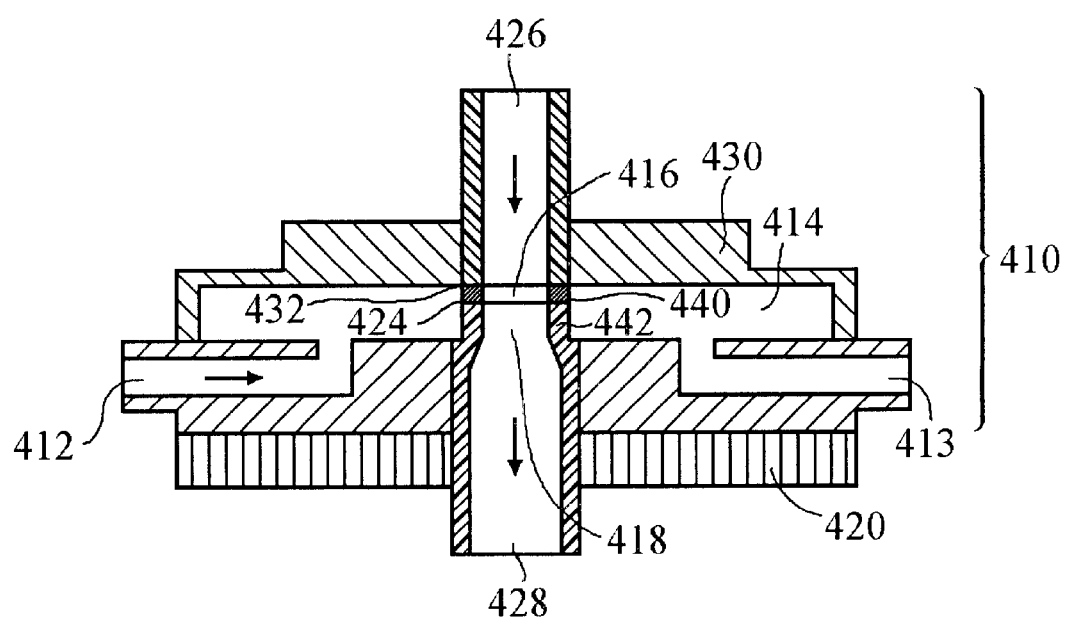
FIG. 5 is a cross-sectional view of an improved over the apparatus apparatus shown in FIG. 4.

As shown in FIG. 5, an improved apparatus over the apparatus in FIG. 4, is also disclosed and presented. An outlet carrier gas tube 428 with a larger diameter than an inlet carrier gas tube 426 allows the mixture of the vaporized source material coming from vent 416 and the carrier gas travelling from the inlet carrier gas tube 426 to flow more smoothly through the gas discharge tube 418 then through the outlet carrier gas tube 428 compared to the apparatus shown in FIG. 4.

Preferred Embodimenst 5

Figure 6:
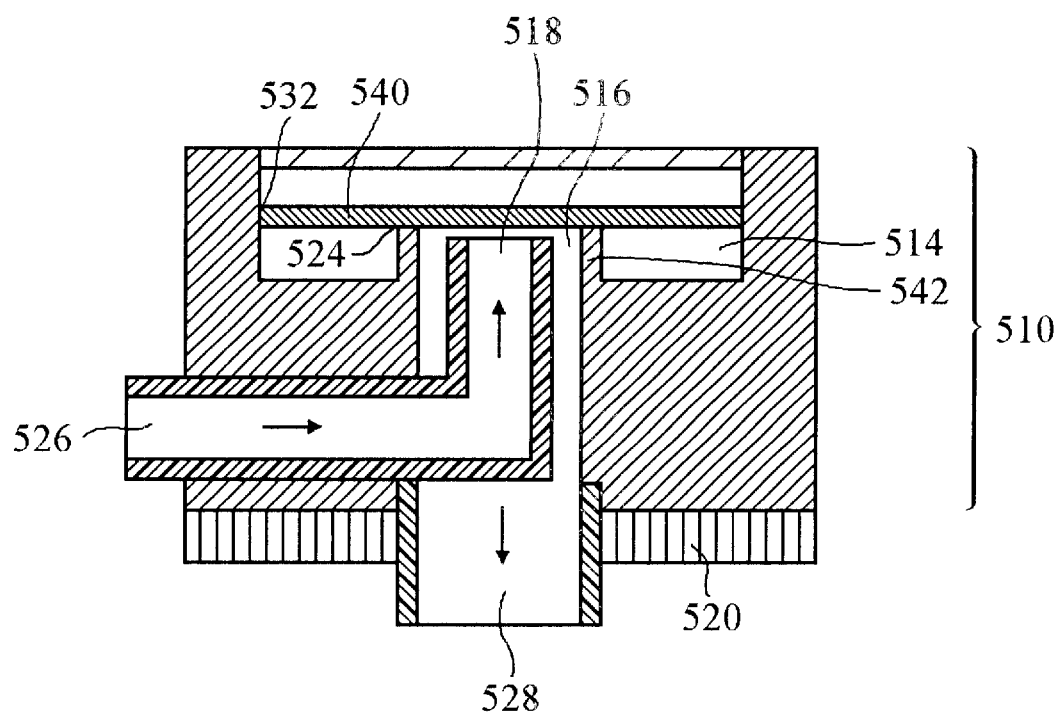
FIG. 6 is a cross-sectional view of an exemplary apparatus with a hybrid type of carrier gas tube, which is a combination of a horizontal inlet carrier gas tube and a vertical outlet carrier gas tube in accordance with the present invention.

Another apparatus for vaporizing liquid source material in accordance with the present invention as shown in FIG. 6 is disclosed and presented here. This apparatus has a "horizontal" inlet carrier gas tube 526 and a "vertical" outlet carrier gas tube 528. Due to the close proximity of the vent tube 542, the Gas discharge tube 518 and the stopper 540, this structure provides a better mixing and discharging ability of the vaporized source material and the carrier gas.

Figure 7:
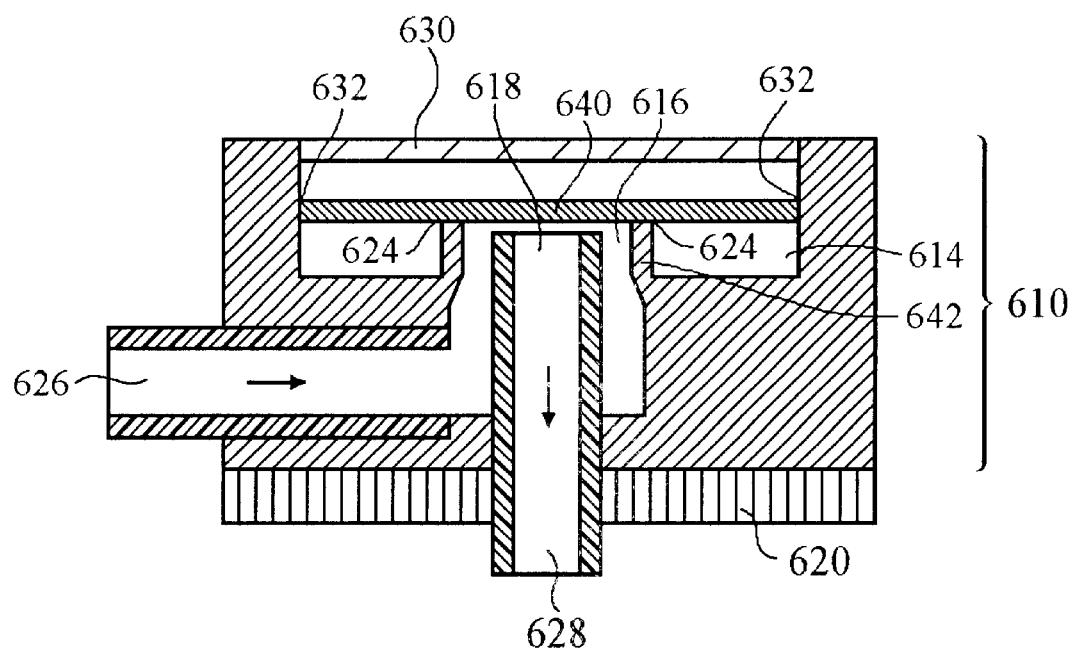
FIG. 7 is a cross-sectional view of an improved over the apparatus shown in FIG. 6 for faster flow of the carrier gas so that the vaporized source material can be carried out to the reaction chamber faster in accordance with the present invention.

An improved apparatus in FIG. 6 presented above is also disclosed and presented here as shown in FIG. 7. This is an improvement over the apparatus in FIG. 6 in terms of yet better mixing capability of the vaporized source material and the carrier gas due to the tapered shape of the stack that is connected to the inlet carrier gas tube 626 as well as the vent tube 642. This shape provides better gas turbulence near the stopper so that the vaporized source material and the carrier gas are mixed faster and uniformly.

The basic functions and workings of the apparatuses disclosed and presented herein, are similar to the apparatus disclosed and presented in the Preferred Embodiment 2.

Preferred Embodiment 6

Figure 8A:
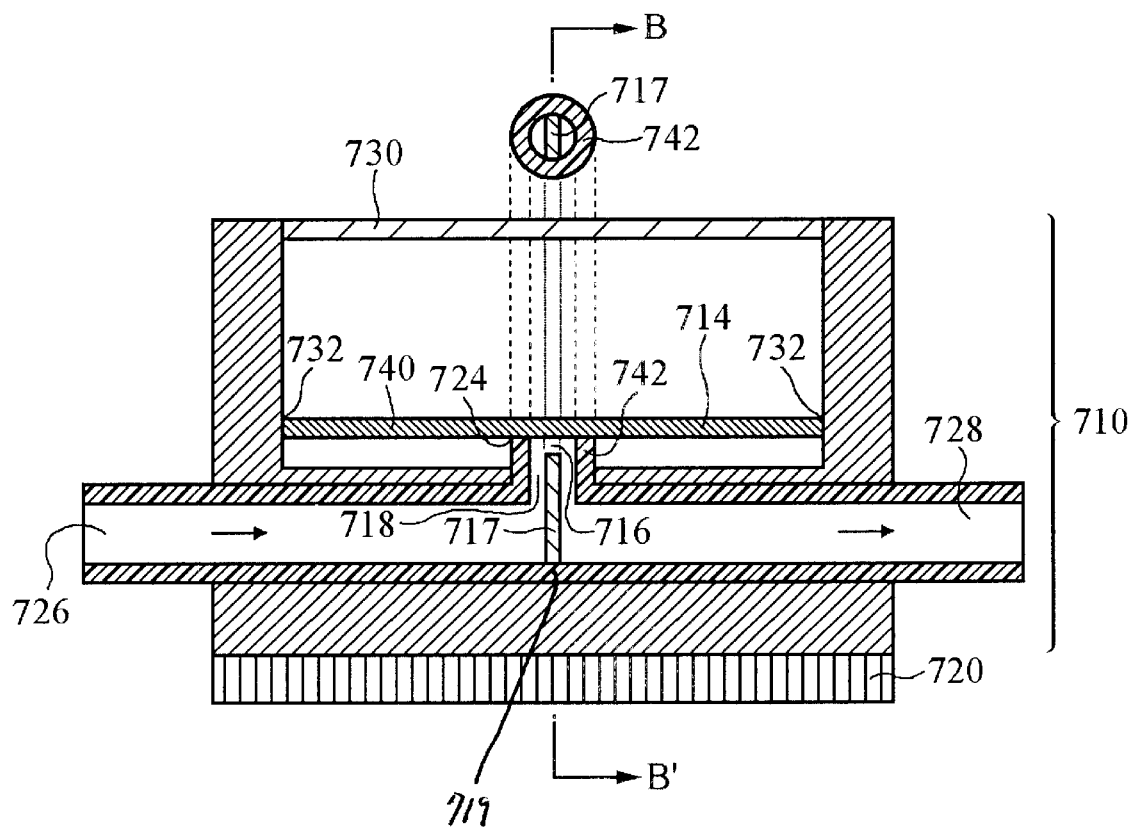
FIG. 8A is a cross-sectional view of an apparatus with more efficient pick-up means of the vaporized source material by the carrier gas in accordance with the present invention.
Figure 8B:
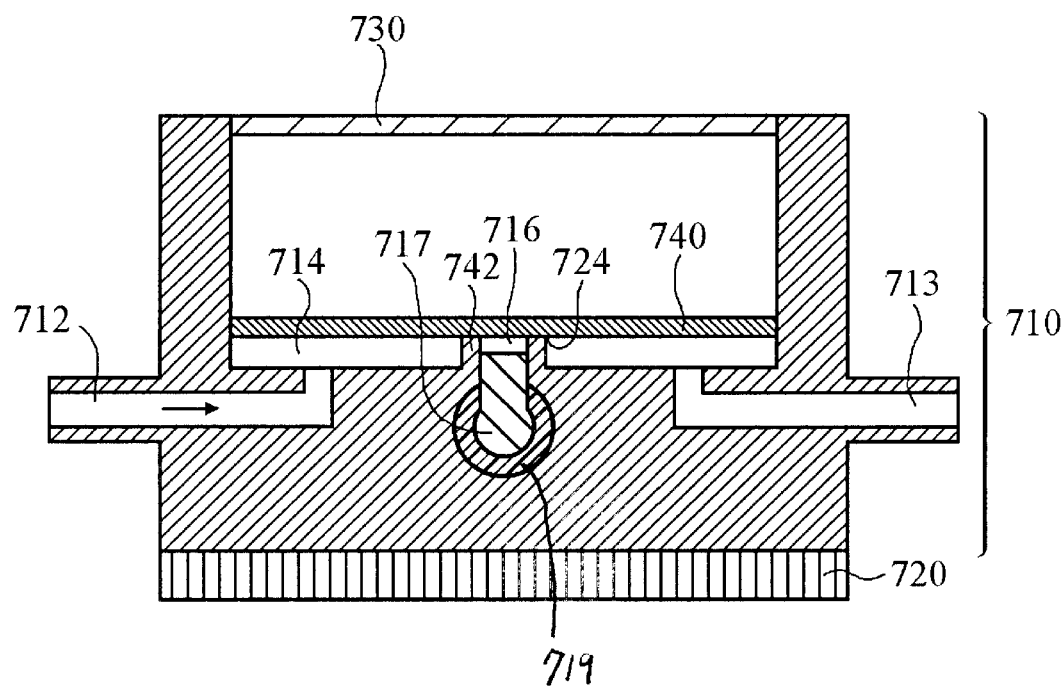
FIG. 8B is a cross-sectional view of the apparatus in FIG. 8A taken along the line B–B' in accordance with the present invention.

Yet another exemplary apparatus for vaporizing liquid source material as shown in FIG. 8A with a cross-sectional view as shown in FIG. 8B along the line B–B' in FIG. 8A is disclosed and presented here.

This example has a gas mixing wall 717 inside the upside-down T-shape configuration of the vent tube 742, the gas discharge tube 718 as well as the inlet-outlet carrier gas tubes 726 and 728, or simply a gas transport tube 719, as shown in FIGS. 8A and 8B. The gas mixing wall 717 plays a better gas mixing role without an elaborate design. The height and width of the gas mixing wall 717 can be adjusted for proper rate of mix of the source and carrier gases as well as the flow of carrier gas through an inlet carrier gas tube 726 and an outlet carrier gas tube 728.

The mechanical partitioning of the mechanical parts can be made in many different ways in such a way that their machining, assembly, disassembly, cleaning and other maintenance become easy, convenient and economical.

In the preferred embodiments described above, some of the exemplary designs, structures and configurations of the apparatus for vaporizing liquid source materials in supplying to the CVD reaction chamber in accordance with the present invention are disclosed and presented herein.

Because the present invention requires only a small exposed area or the area around said vent tube with a stopper for vaporizing the liquid source material, the possibility of being clogged up is significantly reduced unlike the prior art where the excessive liquid source material turned into a viscous state around the stopper area frequently causes clogged-up problems.

While this invention has been particularly shown and described with reference to preferred embodiments thereof, it will be understood by those skilled in the art that various changes in form and details may be made thereto without departing from the spirit and scope of the invention as defined by the appended claims.

What is claimed is:

1. An apparatus for vaporizing a liquid source material with a temperature T1 and a pressure P1 and collecting the resultant vapor source material by means of carrier gas to supply the resultant vapor source material to a desired destination, the apparatus comprising:

a liquid source material supply line;

a reservoir for containing a pressurized liquid source material, with a temperature T2 greater than or equal to T1 and a pressure P2 substantially greater than P1, the liquid source material supply line connected to the reservoir to supply the pressurized liquid source material therein;

a vent with a stopper that opens and closes by the pressure change in the reservoir to expose the pressurized liquid source material to a low pressure with a pressure P3 lower than P2 sufficiently fast to vaporize the liquid source material substantially instantaneously upon the opening of the vent;

a vent tube associated with the vent;

a gas discharge tube connected to the vent tube to transport the vaporized source material from the vent;

an inlet carrier gas tube and an outlet carrier gas tube to carry the vaporized source material by means of carrier gas to a desired destination, the inlet carrier gas tube connected to the outlet carrier gas tube, the inlet and outlet carrier gas tubes connected to the gas discharge tube; and a pressurizer that keeps the liquid source material within the reservoir at a defined pressure using the stopper.

2. The apparatus of claim 1, wherein a top part of the reservoir is left open, and the stopper completes the closure of the reservoir, the stopper moves up and down, the stopper makes a tight contact surface with the top part of the vent, and the vent tube provides a space for the reservoir by limiting the stopper from further descent.

3. The apparatus of claim 2, which further comprises a gas mixing wall of defined height and width, wherein the inlet and outlet carrier gas tubes comprises a carrier gas transport tube, and wherein the gas mixing wall is positioned in the middle of the vent tube and the carrier gas transport tube, thereby providing a better mix of the gases.

4. The apparatus of claim 1, which further comprises a metering pump, wherein the metering pump is connected to the liquid source material supply line and the pressure level is adjusted in such a way that the flow of the liquid source material through the vent is approximately constant, thereby maintaining a constant and steady supply of the vaporized source material.

5. The apparatus of claim 4, wherein the metering pump comprises an active-type metering pump for rapidly lowering its output pressure below the stopper pressure level so that the supply of the vaporized source material is rapidly terminated and the flow of undesirable residual liquid source material into the CVD reaction chamber can be prevented.

6. The apparatus of claim 4, wherein the pressure difference bet ween the reservoir and the stopper is maintained at an appropriate level by adjusting the pressure of the metering pump so that the vent and the stopper repeat the open-and-close actions, thereby supplying the vaporized source material in a fashion of pulsation for easy control of the flow of the vaporized source material.

7. The apparatus of claim 1, which further comprises a clean-out line, wherein the liquid source material supply line, the clean-out line and the inlet carrier gas tube and the outlet carrier gas tube are connected vertically to the reservoir, and the pressurizing means is eliminated so that the stopper acts as a pressurizer.

8. The apparatus of claim 1, which further comprises a clean-out line, wherein the liquid source material supply line is connected horizontally to a bottom part of the reservoir, and a stopper ring is inserted between a bottom part of the inlet carrier gas tube and a top part of the outlet carrier gas tube.

9. The apparatus of claim 8, wherein a bottom part of the outlet carrier gas tube is enlarged so that the carrier gas with the vaporized source material flows easily.

10. The apparatus of claim 1, which further comprises a clean-out line, wherein the outlet carrier gas tube is connected vertically inside the vent tube for better mix of gases.

11. The apparatus of claim 10, wherein a bottom part of the vent tube is enlarged for better mix and flow of the gases.

12. The apparatus of claim 1, which further comprises a heater that heats the liquid source material and the apparatus to a desired level of temperature.

13. The apparatus of claim 1, wherein a liquid source material is selected from the group consisting of TEOS [tetraethoxyorthosilicate, $Si(OCH_2CH_3)_4$], Tantalum pentaethoxide [$Ta(OCH_2CH_3)_5$], Titanium isopropoxide [$Ti(OCH(CH_3)_2)_4$], Zirconium tert-butoxide [$Zr(OC(CH_3)_3)_4$], Hafnium tert-butoxide [$Hf(OC(CH_3)_3)_4$], TDMAT [tetrakisdimethylamidotitanium, $Ti[N(CH_2CH_3)_2)_4]$, TDEAT [tetrakisdiethylamidotitanium, $Ti[N(CH_2CH_3)_2)_4]$, and hexafluoroacetylacetonate (hfac) Cu vinyltrimethylsilane (vtms).

14. The apparatus of claim 1, wherein a liquid source material is a solution comprising:

a solute comprising Ba $(thd)_2$, where thd means tetramethylheptanedionate, Sr $(thd)_2$, Bi $(thd)_3$, La $(thd)_3$, Pb $(thd)_2$, Sr $(thd)_2$, Sr $[Ta(OCH_2CH_3)_6]_2$, or Cu $(hfac)_2$ a solvent being toluene, THF (tetrahydrofuran) of n-butyl acetete;

wherein said solute is dissolved into said solvent to form the liquid source material.

15. The apparatus of claim 1, wherein a liquid source material is a liquid copper source material, and wherein P1 is approximately atmospheric pressure, P2 is above approximately 9 atm, P3 is less than or equal to approximately 20 Torrs, and T1 is approximately room temperature.

16. The apparatus of claim 1, wherein P2 is 12 atm and P3 is approximately 2 to approximately 5 Torrs.

* * * * *

UNITED STATES PATENT AND TRADEMARK OFFICE
CERTIFICATE OF CORRECTION

PATENT NO.    : 6,380,081 B1
DATED         : April 30, 2002
INVENTOR(S)   : Lee

It is certified that error appears in the above-identified patent and that said Letters Patent is hereby corrected as shown below:

<u>Title page,</u>
*Assistant Examiner*, "Alexander G. Guyka" should read -- Alexander G. Ghyka --.

<u>Column 7,</u>
Line 15, "tube 219. vertically" should read -- tube 219, vertically --.

<u>Column 8,</u>
Line 13, "the Gas discharge" should read -- the gas discharge --.

<u>Column 9,</u>
Line 58, "difference bet ween the" should read -- difference between the --.

<u>Column 10,</u>
Line 45, "Cu (hfac)$_2$" should read -- Cu (hfac)$_2$; --.

Signed and Sealed this

Twenty-seventh Day of April, 2004

JON W. DUDAS
*Acting Director of the United States Patent and Trademark Office*